(12) United States Patent
Heinz

(10) Patent No.: US 6,424,078 B1
(45) Date of Patent: Jul. 23, 2002

(54) PIEZOELECTRIC ACTUATOR

(75) Inventor: Rudolf Heinz, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/601,686

(22) PCT Filed: Nov. 5, 1999

(86) PCT No.: PCT/DE99/03530
§ 371 (c)(1),
(2), (4) Date: Aug. 31, 2000

(87) PCT Pub. No.: WO00/34699
PCT Pub. Date: Jun. 15, 2000

(30) Foreign Application Priority Data

Dec. 5, 1998 (DE) .......................... 198 56 202

(51) Int. Cl.[7] ............................... H01L 41/08
(52) U.S. Cl. ....................... 310/328; 310/338
(58) Field of Search ................. 310/341, 342, 310/344, 328, 338

(56) References Cited

U.S. PATENT DOCUMENTS 4,553,059 A * 11/1985 Abe et al. .................. 310/328
4,701,660 A * 10/1987 Baumgartner et al. ...... 310/338

\* cited by examiner

Primary Examiner—Mark O. Budd
(74) Attorney, Agent, or Firm—Ronald E. Greigg

(57) ABSTRACT

The invention relates to a piezoelectric actuator, in particular for actuating control valves or injection valves of internal combustion engines in motor vehicles, having a piezoelectric actuator body, in particular in the form of a multi-layer laminate of stacked layers of piezoelectric material and between them metal or electrically conductive layers acting as electrodes, in which the actuator body is surrounded by a module wall, and defines an intermediate chamber that is divided into an upper chamber portion and a lower chamber portion by an axially movable partition disposed transversely on the actuator head, and a selected one of the upper chamber portion or the lower chamber portion experiences a flow through it of a cooling air stream (L zu, L ab) for cooling the actuator body.

13 Claims, 2 Drawing Sheets

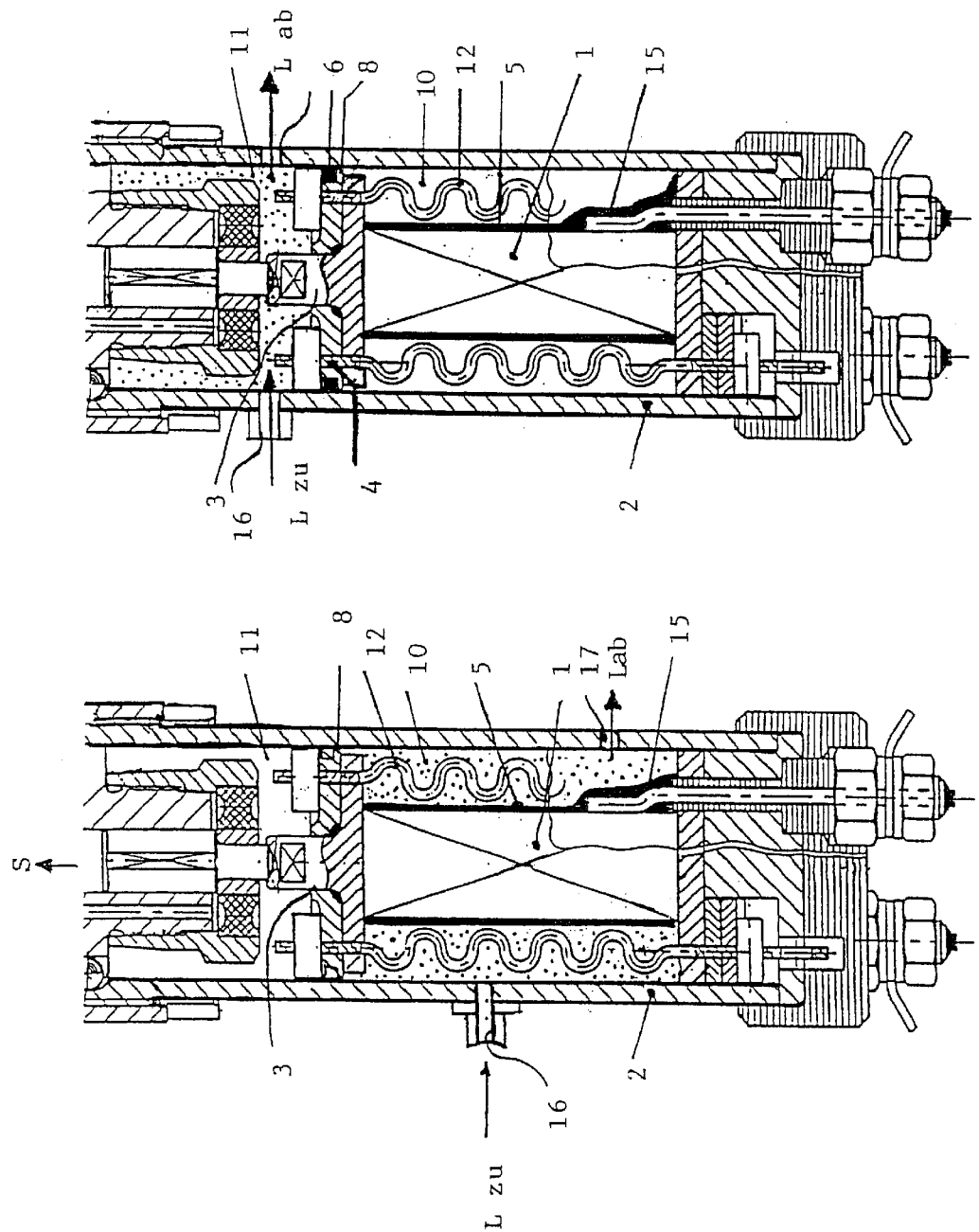

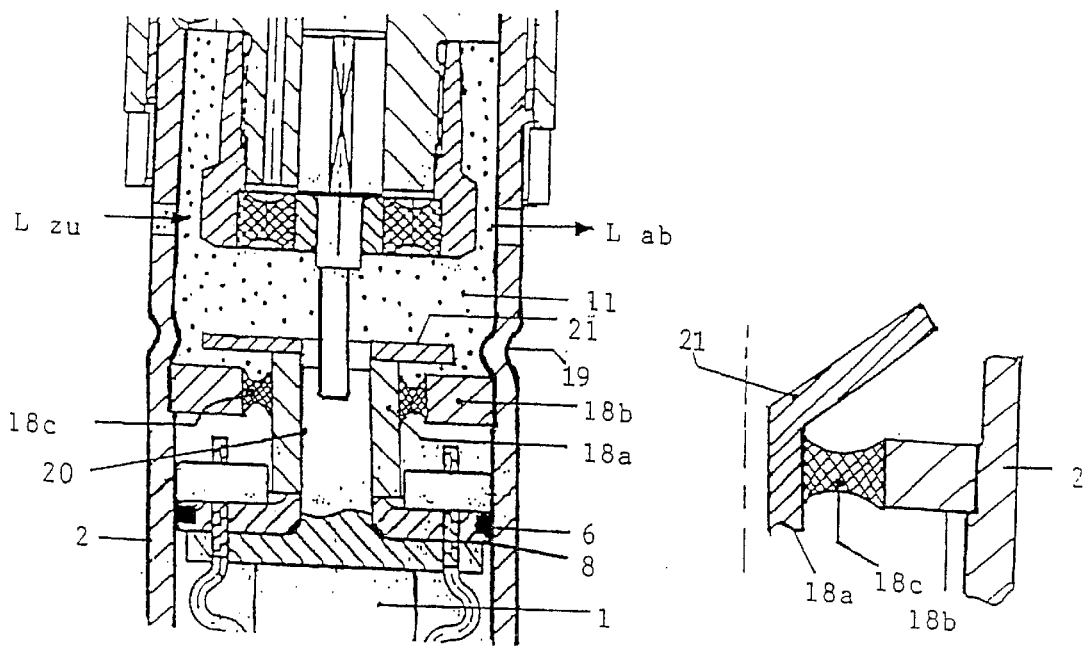
Fig. 3A
Fig. 3B
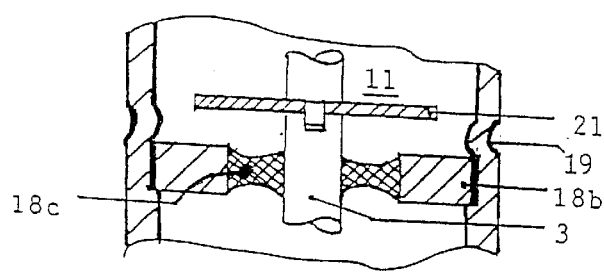
Fig. 3C
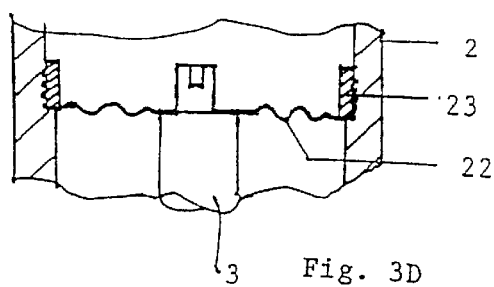
Fig. 3D

PIEZOELECTRIC ACTUATOR

BACKGROUND OF THE INVENTION

Prior Art

The invention directed to improvements in piezoelectric actuators, in particular for actuating control valves or injection valves of internal combustion engines in motor vehicles, having a piezoelectric actuator body, in particular in the form of a multi-layer laminate of stacked layers of piezoelectric material and between them metal or electrically conductive layers acting as electrodes, in which the actuator body is surrounded by a module wall, while maintaining an interstice or intermediate chamber that is divided into an upper chamber and lower chamber by an axially movable partition located transversely on the actuator head.

One such piezoelectric actuator disclosed in German Patent Disclosure DE 196 50 900 A1 of Robert Bosch GmbH.

As is well known, piezoelectric actuators can for instance be used for injection valves of a vehicle motor and in brake systems with anti-lock and traction control systems.

Such injection valves equipped with piezoelectric actuators have an injection nozzle controlled by a tappetlike closure device. An operative face toward the nozzle is disposed on the tappet and is acted upon by the pressure of the fuel supplied to the nozzle; the pressure forces seek to urge the tappet in the opening direction of the closure device. The tappet protrudes with a plungerlike end, whose cross section is larger than the aforementioned operative face, into a control chamber. The pressure effective there seeks to urge the tappet in the closing direction of the closure device. The control chamber communicates with the fuel supply, which is at a high pressure, via an inlet throttle and with a fuel return line that has only low pressure, via an outlet valve that is throttled as a rule or is combined with an outlet throttle. When the outlet valve is closed, a high pressure prevails in the control chamber, by which the tappet is moved in the closing direction of the closure device, counter to the pressure on its operative face toward the nozzle, or is kept in the closing position. Upon opening of the outlet valve, the pressure in the control chamber drops; the magnitude of the drop in pressure is determined by the size of the inlet throttle and by the throttle resistance of the opened outlet valve, or the outlet throttle combined with it. As a result, the pressure in the control chamber decreases when the outlet valve is opened, in such a way that the tappet is moved in the opening direction of the closure device, or held in the open position, by the pressure forces that are operative on its operative face toward the nozzle.

In comparison with electromagnetically actuated injection valves, piezoelectric actuators can switch faster. However, in the design of a piezoelectric actuator, it must be noted that internal losses in the piezoelectric body of the actuator cause lost heat, which has to be dissipated so that the actuator will not overheat. Since the ceramic materials of the piezoelectric ceramic have poorer heat conductivity, the dissipation inside the actuator body, which substantially comprises ceramic material, is unfavorable.

Cooling the actuator with a liquid coolant, such as fuel, water, motor oil and the like, is unfavorable, first because of the risk of a short circuit from the water component that is contained both in the fuel and in motor oil, and second because the actuator module is more expensive because of complicated seals, which must preclude the coolant used from escaping from the actuator module, especially when the actuator becomes heated.

OBJECTS OF THE INVENTION

It is therefore the object of the invention to make a piezoelectric actuator of this kind possible in such a way that cooling can be done during its operation without a liquid coolant, such as motor oil, water or fuel; that the piezoelectric actuator can be installed simply; and that no special seals, as in liquid cooling, are needed.

SUMMARY OF THE INVENTION

To attain these objects, a piezoelectric actuator according to the invention is characterized in that the upper and/or lower chamber, which surrounds the actuator body inside the module wall, experiences a flow through it of cooling air for cooling the actuator body.

A piezoelectric actuator designed according to the invention can use compressed air, which is available always in commercial or utility vehicles, for cooling the actuator body. Even small quantities of air flowing through the actuator module suffice to achieve adequate actuator cooling, and the engineering expense is slight, except for the hose connection to supply the cooling air. The functional safety of the piezoelectric actuator according to the invention is great, since liquid coolant cannot escape from the actuator module.

In one embodiment, a cooling air stream is delivered to the lower chamber, which is located below the partition resting crosswise on the actuator head. In this embodiment, by means of an elastomer jacket or shrink-fit hose sheathing the actuator body and its flow connections, care is taken to prevent any moisture contained in the cooling air stream from causing damage or short circuits in the interior of the actuator module. In this case, special provisions for sealing off the upper chamber in moisture-proof fashion from the lower chamber through which the cooling air stream flows are unnecessary.

In an alternative embodiment, only the upper chamber above the actuator head has a cooling air stream flowing through it. In that case, care is taken to assure that the upper chamber is sealed off from the lower chamber in moisture-proof fashion. In this type of embodiment, the engine heat does not reach the actuator body, either. To that end, the partition resting crosswise on the actuator head is sealed off on its periphery from the actuator wall by an O-ring. In addition, as in the first embodiment, in which the cooling air stream flows through the lower chamber, the actuator body and its connection lines are sheathed by an elastomer jacket or shrink-fit hose. Furthermore, an additional elastomer sealing ring can be provided for sealing purposes above the partition; it is fixed to the module wall on its periphery by radial bumps or an annular bead. In the interior region, sealing of the upper chamber from the lower chamber can be attained by an adhesive layer with good thermal conductivity.

In a further variant, a cooling baffle can additionally be joined to the partition in a manner assuring good thermal conductivity and can assure additional cooling, since it is located in the upper chamber through which the cooling air flows.

Instead of an elastic seal of elastomer material, a steel diaphragm can also be used, which at the same time has good thermal conductivity and assures additional heat dissipation from the lower chamber of the actuator module to the upper chamber, through which the cooling air flows. Such a steel diaphragm can be joined tightly and thermally conductively to the module wall by screwing, using a screw ring.

Especially advantageously, the invention can be employed in commercial vehicles for Diesel fuel injection in a common rail injector system. As noted, in commercial vehicles compressed air is available, and a slight quantity of it can be utilized to cool the piezoelectric actuator.

Further advantageous characteristics of a piezoelectric actuator designed according to the invention will become even more apparent from the description of various exemplary embodiments, taken in conjunction with the drawing.

BRIEF DESCRIPTION OF THE DRAWINGS

FIG. 1, in the form of a schematic longitudinal section, shows a first embodiment according to the invention of a piezoelectric actuator;

FIG. 2, also in the form of a schematic longitudinal section, shows a second embodiment according to the invention of a piezoelectric actuator;

FIGS. 3A, 3B, 3C and 3D show details of preferred refinements of the second embodiment according to the invention of a piezoelectric actuator shown in FIG. 2.

DESCRIPTION OF THE PREFERRED EMBODIMENTS

In the first exemplary embodiment, shown as a fragmentary longitudinal section in FIG. 1, of a piezoelectric actuator of the invention, an actuator body 1, which can take the form of a multi-layer laminate of stacked layers of piezoelectric material and metal or electrically conductive layers acting as electrodes located between them, is elastically prestressed with its face ends on the left and right by two spring bands 12 between a lower, stationary actuator base, not identified by reference numeral, and an upper, axially movable plate resting on the actuator head 3 and embodied as a partition 8. The actuator module is enclosed by a metal actuator wall 2.

If the actuator body 1 is acted upon at its electrodes by a pulsating electrical voltage, it executes similarly pulsating strokes, changing the spacing between its face ends that are fastened by the spring bands 12 between the upper, movable plate and the lower actuator base. These strokes are transmitted (see action arrow S) via a piston to the needle (not shown) of a valve. It should also be noted that the electrode lead lines, only one of which is visible in FIG. 1, are extended downward to connection terminals, not identified by reference numeral. The axially movable partition 8 also divides the intermediate chamber, surrounding the actuator body 1, into a lower chamber 10, which directly the surrounds the actuator body 1, and an upper chamber 11, located above the actuator head 3.

In the embodiment shown in FIG. 1, the lower portion of the wall 2 of the actuator module has an air inflow opening 16, through which cooling air L zu flows in, and an air outlet opening 17, through which cooling air L ab flows out. As can be seen, the air inflow opening 16 and the air outlet opening 17 are disposed opposite one another in the module wall 2 and are offset from one another axially. As a result, an especially effective flow of air around the actuator body 1 is achieved. The actuator body 1, including its electrode lead lines, is protected against direct moisture in the air by an elastomer jacket or shrink-fit hose 5, 15.

However, the elastomer layer 5, 15 cannot protect the actuator body 1 against moisture with certainty as soon as major water formation occurs.

Since no special provisions for sealing off the upper chamber 11 from the lower chamber 10 are made, cooling air can also reach the upper chamber 11 in a slight amount.

FIG. 2 shows a second embodiment of a piezoelectric actuator according to the invention. In the embodiment, also shown in longitudinal section in FIG. 2, the lower chamber 10 is sealed off from the upper chamber 11 in a moisture-proof fashion, and only the upper chamber 11 has cooling air flowing through it. To that end, an air inflow opening 16 and opposite it an air outlet opening 17 are made in the module wall 2, and through them cooling air L zu flows in and, after its cooling action, this air flows out as outflowing air L ab. The air stream at this point also assures that the heat from the engine region will not reach the actuator body 1 by heat dissipation.

To seal off the lower chamber from the upper chamber 11, the partition 8 is sealed off in the region of the actuator head 3 by an O-ring 6, which rests on the inside of the module wall 2. This sealing with the O-ring 6 makes the axial mobility of the partition 8 possible and is sufficient to prevent water from accumulating in the actual actuator region, that is, the region of the actuator body 1.

Seams 4, at points where the tension springs 12 pierce the movable partition 8, are tightly glued with adhesive.

It is advantageous here as well if, as in the embodiment shown in FIG. 1, the actuator body 1 and the electrode terminals are each sheathed by a respective elastomer jacket 5, 15. Instead of the elastomer jacket, an elastic paint, or a shrink-fit hose can also be used for sealing and insulation.

FIG. 3A, in an enlarged view, shows a portion, located around the actuator head 3, of an improved version of the embodiment of FIG. 2. To improve the sealing at the crosswise partition with the O-ring 6, in FIGS. 3A through 3C an elastomer sealing ring 18 is built in; it is fixed in its axial position by radial bumps 19 in the module wall. The elastomer sealing ring according to FIG. 3A can be a composite body comprising a radially disposed inner metal ring 18a, a radially disposed outer metal ring 18b, and an elastomer ring 18c enclosed between them. On the inside, in the region of the actuator head, sealing is done by an adhesive layer 20 that has good thermal conductivity.

For better heat dissipation, a cooling baffle 21 is additionally joined, with good thermal conductivity, to the inner metal ring 18a. The cooling baffle 21 protrudes into the upper chamber 11 through which the cooling air flows.

FIG. 3B shows a variant in which the cooling baffle 21 is integral with the elastomer sealing ring 18 made up of the three portions 18a, 18b 18c.

In FIG. 3C a further variant is shown, in which the sealing is done with an elastomer ring 18 which is designed as in FIG. 3A but without a solid inner ring, as in a rotary shaft seal. The inner ring 18a is replaced by the actuator head 3.

FIG. 3D, finally, shows that the sealing of the lower chamber 10 from the upper chamber 11 is done with a steel diaphragm 12, instead of with an elastomer seal. A metal diaphragm 22 of this kind has an excellent sealing action and at the same time good thermal conductivity. The diaphragm 22 in FIG. 3D is fixed to the module wall 2 by a screw ring 23 and nevertheless enables the axial mobility of the actuator head. The diaphragm is welded on the inside to the actuator head 3.

With the cooling means according to the invention, that is, the cooling air flowing through the lower chamber 10 and/or upper chamber 11, and optionally with the additional provisions, such as the cooling baffle and the connection with good thermal conductivity between the cooling baffle and the partition 8 in the region of the actuator head 3 or with the tight steel diaphragm 22 in FIG. 3D, a piezoelectric actuator according to the invention is highly suited to switching injectors, of the kind used for injecting Diesel fuel in common rail injector systems. Especially in commercial vehicles, a slight proportion of the compressed air that is present anyway can be utilized to cool the piezoelectric actuator. Even slight quantities of air already suffice to provide adequate actuator cooling, and the engineering expense aside from the hose connection for supplying and removing the cooling air is slight. The functional safety is great, because no liquid coolant, such as fuel, motor oil or water, is used. In the second embodiment, in which the cooling air is supplied only to the upper chamber of the actuator module, the actuator is reliably protected against moisture in the air, and the engine heat during operation does not reach the actuator.

The foregoing relates to a preferred exemplary of embodiments of the invention, it being understood that other variants and embodiments thereof are possible within the spirit and scope of the invention, the latter being defined by the appended claims.

What is claimed is:

1. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10,11) therewithin, which chamber is divided into an upper chamber portion (11) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), the module wall (2) in the lower chamber portion (10) is provided with an air inlet opening (16) and an air outlet opening (17), and the actuator body, including its flow connections in the region of the lower chamber portion (10) through which air flows, is protected against moisture by an elastomer jacket (5, 15).

2. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10, 11) therewithin, which chamber is divided into an upper chamber portion (11) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), only the upper chamber portion (11) above the actuator head (3) experiences a cooling air stream through it, and an elastomer sealing ring (18) is provided for sealing off the upper chamber portion (11) from the lower chamber portion (10) above the transverse partition (8).

3. The piezoelectric actuator of claim 2, in which the elastomer sealing ring (18) is axially fixed by an annular bead made in the module wall (2).

4. The piezoelectric actuator of claim 2, in which the upper chamber portion (11) is sealed off from the lower chamber portion interiorly by a layer of adhesive (20) that is a good heat conductor.

5. The piezoelectric actuator of claim 2, in which the elastomer sealing ring (18) is axially fixed by radial bumps (19).

6. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10, 11) therewithin, which chamber is divided into an upper chamber portion (11) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1),and the partition disposed transversely (8) is made of metal and is joined with good thermal conductivity to a cooling baffle (21) that protrudes into the upper chamber portion (11).

7. The piezoelectric actuator of claim 6, in which the cooling baffle and the elastomer sealing ring form a unit.

8. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10, 11) therewithin, which chamber is divided into an upper chamber portion (11) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), only the upper chamber portion (11) above the actuator head (3) experiences a cooling air stream through it, and the actuator body (1), including its flow connections, is sheathed in the lower chamber portion (10) by an elastomer jacket (5, 15).

9. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10, 11) therewithin, which chamber is divided into an upper chamber portion (11) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), only the upper chamber portion (11) above the actuator head (3) experiences a cooling air stream through it, and the actuator body (1), including its flow connections, is sheathed in the lower chamber portion (10) by a shrink-fit hose.

10. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10, 11) therewithin, which chamber is divided into an upper chamber portion (11) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), only the upper chamber portion (11) above the actuator head (3) experiences a cooling air stream through it, and the actuator body (1), including its flow connections, is sheathed in the lower chamber portion (10) by a layer of paint to protect against moisture.

11. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10, 11) therewithin, which chamber is divided into an upper chamber portion (1 1) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), the module wall (2) in the lower chamber portion (10) is provided with an air inlet opening (16) and an air outlet opening (17), and the actuator body, including its flow connections in the region of the lower chamber portion (10) through which air flows, is protected against moisture by a shrink-fit hose.

12. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), the module wall (2) in the lower chamber portion (10) is provided with an air inlet opening (16) and an air outlet opening (17), and the actuator body, including its flow connections in the region of the lower chamber (10) through which air flows, is protected against moisture by a layer of paint.

13. A piezoelectric actuator for actuating control valves or injection valves of internal combustion engines in motor vehicles, having a piezoelectric actuator body (1) formed of a multi-layer laminate of stacked layers of piezoelectric material and between them electrically conductive layers acting as electrodes, in which the actuator body (1) is surrounded by a module wall (2), said module wall defines an intermediate chamber (10, 11) therewithin, which chamber is divided into an upper chamber portion (11) and a lower chamber portion (10) by an axially movable partition (8) located transversely on an actuator head of said actuator body, and at least a selected one of the upper chamber (11) and the lower chamber (10) experiences a flow through it of a cooling air stream (L zu, L ab) for cooling the actuator body (1), only the upper chamber portion (11) above the actuator head (3) experiences a cooling air stream through it, a steel diaphragm (22) is provided, above the transverse partition (8), which diaphragm elastically seals off the upper chamber portion (11) from the lower chamber portion (10), and the steel diaphragm (22) is fixed to an interior of the module wall (2) by a screw ring (23) and has good thermal conductivity.

* * * * *